United States Patent
Gries et al.

(10) Patent No.: US 6,274,285 B1
(45) Date of Patent: Aug. 14, 2001

(54) RADIATION-SENSITIVE RECORDING MATERIAL FOR THE PRODUCTION OF DRIOGRAPHIC OFFSET PRINTING PLATES

(75) Inventors: Willi-Kurt Gries, Mainz; Hans-Joachim Schlosser, Wiesbaden, both of (DE)

(73) Assignee: Agfa-Gevaert NV, Mortsel (BE)

( * ) Notice: Subject to any disclaimer, the term of this patent is extended or adjusted under 35 U.S.C. 154(b) by 0 days.

(21) Appl. No.: 09/438,429

(22) Filed: Nov. 12, 1999

(30) Foreign Application Priority Data

Nov. 11, 1919 (DE) .............................. 198 52 258

(51) Int. Cl.$^7$ .............................. G03F 7/021; G03F 7/30
(52) U.S. Cl. .................. 430/162; 430/175; 430/176; 430/303
(58) Field of Search .................. 430/175, 176, 430/303, 162

(56) References Cited

U.S. PATENT DOCUMENTS

| | | |
|---|---|---|
| 3,235,384 | 2/1966 | Neugebauer et al. ............ 96/33 |
| 3,867,147 | 2/1975 | Teuscher ......................... 96/33 |
| 4,021,243 | 5/1977 | Steppan et al. .................. 96/36.4 |
| 4,937,169 * | 6/1990 | Schlosser ........................ 430/162 |
| 5,225,309 * | 7/1993 | Suzuki et al. ................... 430/158 |
| 5,773,187 * | 6/1998 | Gries et al. ..................... 430/162 |
| 5,811,210 * | 9/1998 | Kawamura et al. ............. 430/17 |

FOREIGN PATENT DOCUMENTS

| | | |
|---|---|---|
| 0 394 923 | 10/1990 | (EP) . |
| 0 394 924 | 10/1990 | (EP) . |
| 1 399 949 | 7/1975 | (GB) . |

* cited by examiner

*Primary Examiner*—John S. Chu
(74) *Attorney, Agent, or Firm*—Foley & Lardner

(57) ABSTRACT

A recording material is provided, having, in this sequence, a support, a radiation-sensitive layer and a silicone layer. The radiation-sensitive layer contains, as a radiation-sensitive component, a diazonium salt polycondensation product and, as a binder, a homopolymer of ($C_1$–$C_{12}$) alkyl vinyl ether units and/or a copolymer including at least 5 mol-% of such units, and being free of aliphatic hydroxyl groups. In a process to produce a printing plate for driographic offset printing, this recording material is exposed imagewise and subsequently developed using water or an aqueous solution.

29 Claims, No Drawings

RADIATION-SENSITIVE RECORDING MATERIAL FOR THE PRODUCTION OF DRIOGRAPHIC OFFSET PRINTING PLATES

BACKGROUND OF THE INVENTION

1. Field of the Invention

The invention relates to a recording material having, in sequence, a support, a radiation-sensitive layer and a silicone layer. It furthermore relates to a process for the production of a printing plate for driographic offset printing from the recording material.

2. Description of the Related Art

Recording materials from which driographic (i.e., water free) offset printing plates can be produced are already known. Thus, Great Britain Patent GB 1,399,949 discloses a positive-working material having a support, a radiation-sensitive layer which takes up printing ink, a silicone layer which repels printing ink and preferably also a transparent protective film. The radiation-sensitive layer comprises, as essential constituents, a photopolymerizable, ethylenically unsaturated monomer or oligomer having a boiling point of above 100° C., a photoinitiator and generally also a binder. The binder is preferably a vinyl polymer or copolymer (such as polyvinyl acetate, polyvinyl alcohol, polyvinylbutyral, polyvinyl butyl ether, polyvinyl chloride or polyethylene), a polyether (such as polyethylene oxide or polypropylene oxide), a polyamide, a polyester, a cellulose derivative, a urea-formaldehyde resin, an alkyd resin, a melamine-formaldehyde resin or a phenol-formaldehyde resin. In the exposed areas of the radiation-sensitive layer, the monomer or oligomer is polymerized, causing it to adhere to the silicone layer. The recording material is then treated with a developer solution. During this treatment, the silicone layer swells to a greater extent in the unexposed areas and can be removed by brushing or similar measures. In the exposed areas, by contrast, the silicone layer remains adhering to the photosensitive layer. The adhesion between the photosensitive layer and the silicone layer can be further increased by heating or by full-area exposure. At the same time, the photosensitive layer is cured in the originally unexposed areas, which reduces the scratch sensitivity of the driographic printing plates and allows a longer print run.

The recording material according to European Published Application No. EP-A 0 394 923 likewise comprises a support, a photosensitive layer and a silicone layer. The photosensitive component here is a diazonium salt polycondensation product. The photosensitive layer contains, as a further essential component, a polymeric binder containing units of an ester containing aliphatic hydroxyl groups, or of an amide of acrylic or methacrylic acid. It is in general a polymer containing units of a hydroxyalky 1 (meth)acrylate or (meth)acrylamide. In addition, it may also contain units of other monomers. Examples thereof are monomers containing aromatic hydroxyl groups (such as N-(4-hydroxyphenyl) acrylamide or -methacrylamide, 2-, 3- or 4-hydroxystyrene, (2-, 3-or 4-hydroxyphenyl)acrylate or -methacrylate). Furthermore, the monomers may also be a,b-unsaturated carboxylic acids, substituted alkyl acrylates or -methacrylates, vinyl ethers (such as ethyl vinyl ether, butyl vinyl ether or phenyl vinyl ether), styrenes, vinyl ketones, olefins, N-vinylpyrrolidone, N-vinylcarbazole, 4-vinylpyridine, acrylonitrile or methacrylonitrile. The proportion of hydroxyl groups in the binder (this is apparently taken to mean the proportion of units containing aliphatic hydroxyl groups) is said to be from 5 to 100% by weight, preferably from 20 to 100% by weight, since otherwise the adhesion between the radiation-sensitive layer and the silicone layer is inadequate. After imagewise exposure, the recording material is developed using an aqueous solution containing polar solvents (such as alcohols, ethylene glycol monoalkyl ethers, ketones or esters), alkaline compounds, surfactants and aliphatic, aromatic or halogenated hydrocarbons (such as hexane, heptane, toluene or xylene). This removes the unexposed areas of the radiation-sensitive layer together with the overlying areas of the silicone layer. In addition, a primer layer is arranged between the aluminum support and the radiation-sensitive layer. This is not removed during development. During printing, the ink is transferred from the primer layer, while the areas of the silicone layer which remain repel the printing ink.

The known recording materials for the production of driographic printing plates require organic solvents during development. However, this is disadvantageous for reasons of occupational safety and environmental protection. Disposal of the spent developer solutions is complex and costly. The present invention is directed to overcoming or at least reducing the above problem.

SUMMARY OF THE INVENTION

In accordance with one aspect of the present invention, there is provided a recording material comprising a support, a radiation sensitive layer and a silicone layer, wherein the radiation-sensitive layer contains a radiation-sensitive component comprising a diazonium salt polycondensation product and a binder comprising at least one of a homopolymer of ($C_1$–$C_{12}$) alkyl vinyl ether units and a copolymer including at least 5 mol percent of such units, wherein the binder is at least substantially free of aliphatic hydroxyl groups. In accordance with another aspect of the invention, there is provided a process for producing a printing plate for driographic offset printing.

Further objects, features and advantages of the invention will become apparent from the detailed description of preferred embodiments that follows.

DETAILED DESCRIPTION OF THE PREFERRED EMBODIMENTS

The recording material of the present invention has a simple structure. It comprises few layers, and preferably lacks a primer layer. After imagewise exposure, the recording material is capable of development with aqueous solutions, preferably with pure water, to give a printing plate which does not require any damping solution during printing (i.e., a driographic printing plate(s)). In addition, preferably only the silicone layer, but not the radiation-sensitive layer, is removed in the unexposed areas during development. During printing, the ink is transferred from the radiation-sensitve layer areas that are not covered by the silicone layer. Furthermore, the loading of the developer with constituents of the radiation-sensitive layer should be avoided, which leads to a longer service life of the developer.

In a preferred embodiment of the present invention, the binder contains polymers consisting of or comprising methyl vinyl ether units. For example, the binder may be a homopolymer of methyl vinyl ether units or a copolymer containing methyl vinyl ether units. The homopolymers preferably have a K value of from 10 to 80. The copolymers preferably generally have a random or alternating structure, i.e., they are not block copolymers. The preferred units in the copolymers are units of maleic anhydride or monoalkyl maleates, in particular, units of mono ($C_1$–$C_6$) alkyl maleates, such as monoethyl, monoisopropyl or monobutyl maleate. Methyl vinyl ether-maleic anhydride copolymers are available, for example, under the name ⁷Gantrez AN (CAS No. 108-88-3) from GAF Chemicals Corp., USA.

The support may comprise a metal plate or foil. The preferred support materials are plates or foils of aluminum or its alloys. The support is preferably pretreated. Support materials based on aluminum may be mechanically and/or electrochemically roughened and may also be anodically oxidized. Chemical pre-treatment, for example with polyvinylphosphonic acid, silicates, phosphates, hexafluorozirconates or hydrolyzed tetraethyl orthosilicate, is also possible thereafter. Since, in contrast to conventional planographic printing plates, a hydrophilic support surface is not necessary, it is also possible to use support materials such as copper, brass or other oleophilic metals or metal alloys, and also plastics, such as polyester, polycarbonate, polyimide or cellulose acetate.

The polymers used as binders in the radiation-sensitive layer generally have a molecular weight, $M_w$, in the range from 40,000 to 2,000,000, preferably from 50,000 to 1,000,000, particularly preferably from 80,000 to 500,000. The proportion of binders is generally from 5 to 40% by weight, based on the total weight of the non-volatile constituents of the radiation-sensitive layer.

The binder mixture contains, as radiation-sensitive component, a product of the condensation of an aromatic diazonium salt. Condensation products of this type are known and are described, for example, in German Published Application DE-A 12 14 086, which is equivalent to U.S. Pat. No. 3,235,384, incorporated herein by reference in their entirety.

They are generally prepared by condensation of a polycyclic aromatic diazonium compound, preferably of substituted or unsubstituted diphenylamine-4-diazonium salts, with active carbonyl compounds, preferably methoxymethyldiphenyl ether or formaldehyde, in highly acidic medium, preferably concentrated phosphoric acid.

U.S. Pat. Nos. 3,867,147 and 4,021,243, both incorporated herein by reference in their entirety, describe further condensation products whose units additionally formed by condensation are free from diazonium salt groups and are preferably derived from aromatic amines, phenols, phenol ethers, aromatic thioethers, aromatic hydrocarbons, aromatic heterocyclic compounds or organic acid amides.

The diazonium salt units A—$N_2$X are preferably derived from compounds of the formula ($R^1$—$R^2$—)$_p R^3$—$N_2$X. In this formula, $R^1$ denotes an aromatic radical having at least one position which is capable of condensation with an active carbonyl compound, $R^2$ denotes a single bond or one of the groups —($CH_2$)$_{q-NR^4}$—, —O—($CH_2$)$_r$—$NR^4$—, —S—($CH_2$)$_r$—$NR^4$—, —S—$CH_2$CO—$NR^4$—, —O—$R^5$—O—, —S—or BCO—$NR^4$—, $R^3$ denotes a substituted or unsubstituted phenylene group, $R^4$ denotes hydrogen, an alkyl group having 1 to 5 carbon atoms, an aralkyl group having 7 to 12 carbon atoms or an aryl group having 6 to 12 carbon atoms, $R^5$ denotes an arylene group having 6 to 12 carbon atoms, p denotes an integer from 1 to 3, q denotes a number from 0 to 5, r denotes a number from 2 to 5, and X denotes an anion which produces solubility in water or suitable solvents.

The anion X is preferably chloride, sulfate, phosphate or a substituted or unsubstituted alkanesulfonate having 1 B 4 carbon atoms, for example methanesulfonate, or aminoalkanesulfonate (see European Published Application EP-A 0 224 162, incorporated herein by reference in its entirety), p-toluenesulfonate, mesitylenesulfonate, hexafluorophosphate or the like.

Preference is given to condensation products derived from substituted or unsubstituted diphenylamine-4-diazonium salts, especially 3-methoxydiphenylamine-4-diazonium salts, and of these, the easily accessible condensation products with formaldehyde. The condensation is preferably carried out in concentrated sulfuric, phosphoric or methanesulfonic acid, in particular in phosphoric acid. Sulfuric, phosphoric, methanesulfonic, p-toluenesulfonic and citric acids are suitable for stabilization. The proportion of the radiation-sensitive component is generally from 20 to 80% by weight, preferably from 30 to 70% by weight, particularly preferably from 40 to 65% by weight, in each case based on the total weight of the non-volatile constituents of the radiation-sensitive layer.

If desired, the radiation-sensitive layer may also contain dyes, plasticizers (such as glycerol), other polymeric binders (including those containing aliphatic hydroxyl groups) and generally conventional additives, such as flow-control agents and coating additives, in secondary amounts. The proportion of such constituents is generally up to 30% by weight, preferably up to 20% by weight, in each case based on the total weight of the non-volatile constituents of the radiation-sensitive layer.

The weight of the radiation-sensitive layer is generally from about 0.5 to 3.0 g/m², preferably from 0.8 to 1.5 g/m².

The silicone layer can in principle be produced from any silicone rubber which is sufficiently ink-repellent to allow printing without a damping solution.

The term "silicone rubber" here, in accordance with the definition by Noll, "Chemie und Technologie der Silikone" [Chemistry and Technology of the Silicones], Verlag Chemie, 1968, page 332, (incorporated herein by reference), is taken to mean a high-molecular-weight, essentially linear diorganopolysiloxane. For crosslinked or vulcanized products, by contrast, the term "vulcanized silicone rubber" is used. In any case, a silicone rubber solution is applied to the radiation-sensitive layer, dried and at the same time crosslinked.

The silicone rubbers can be one- or multicomponent rubbers. Examples thereof are given in German Published Applications DE-A No. 23 50 211, No. 23 57 871 and No. 23 59 102, incorporated herein by reference in their entirety. Preference is given to condensation silicone rubbers, for example one-component silicone rubbers (RTV-1). These are usually based on polydimethylsiloxanes carrying hydrogen atoms, acetyl, oxime, alkoxy or amino groups or other functional groups at the ends. The methyl groups in the chain may be replaced by other alkyl groups, haloalkyl groups or unsubstituted or substituted aryl groups. The terminal functional groups are readily hydrolyzable and cure in the presence of moisture in a period of from a few minutes to a few hours.

The multicomponent silicone rubbers can be crosslinked by addition or condensation. The addition-crosslinkable grades generally contain two different polysiloxanes. The first polysiloxane is present in a proportion of from 70 to 99% by weight and contains alkylene groups (specifically vinyl groups) which are bonded to the silicon atoms of the main chain. The other is present in a proportion of from 1 to 10% by weight. In this polysiloxane, hydrogen atoms are bonded directly to silicon atoms. The addition reaction then takes place in the presence of from about 0.0005 to 0.002% by weight of a platinum catalyst at temperatures above 50° C. Multicomponent silicone rubbers have the advantage of crosslinking very rapidly at elevated temperature (about 100° C.). The time in which they can be worked, the so-called "pot life", is, in contrast, frequently relatively short.

The condensation-crosslinkable mixtures contain diorganopolysiloxanes containing reactive terminal groups, such as hydroxyl or acetoxy groups. These are crosslinked with silanes or oligosilanes in the presence of catalysts. The crosslinking agents have a proportion of from 2 to 10% by weight, based on the total weight of the silicone layer. The catalysts have a proportion of from 0.01 to 6% by weight, again based on the total weight of the silicone layer. These combinations likewise react very rapidly and therefore only have a limited pot life.

The silicone layer may also contain further components. These can provide additional crosslinking, better adhesion, mechanical reinforcement or coloration. The further components have a proportion of not more than 10% by weight, preferably not more than 5% by weight, in each case based on the total weight of the silicone layer.

A preferred mixture consists of hydroxyl-terminated polydimethylsiloxanes, a silane crosslinking component (in particular tetra- or trifunctional alkoxy-, acetoxy-, amido-, amino-, aminoxy-, ketoxime- or enoxysilane), a crosslinking catalyst (in particular an organotin or organotitanium compound) and, if desired, further components (in particular organopolysiloxane compounds containing Si-H bonds, platinum catalysts for additional addition crosslinking, silanes having adhesion-improving properties, reaction retardants, fillers and/or dyes). The above silane crosslinking components and the reactions occurring during crosslinking have been described by J. J. Lebrun and H.

Porte in "Comprehensive Polymer Science", Volume 5 [1989]593 B 609, incorporated herein by reference.

After application as a film, the silicone rubbers are crosslinked in a known manner through the action of moisture or of their own volition at room temperature or elevated temperature to give a vulcanized silicone rubber which is essentially insoluble in organic solvents. The weight of the finished silicone layer is generally from 1.0 to 5.0 g/m$^2$, preferably from 1.2 to 3.5 g/m$^2$, particularly preferably from 1.5 to 3.0 g/m$^2$.

A discontinuous matting layer may, if desired, be present on the silicone layer. It serves to improve the copying behavior by shortening the time taken to produce a constant vacuum in the vacuum contact copying frame. If the matting layer is not present, air bubbles may remain between the film mask and the (likewise smooth) silicone layer, in spite of application of a vacuum, so that the separation between the mask and the radiation-sensitive layer is not the same everywhere. During subsequent exposure, flaws can then occur. The matting layer generally consists of a water-soluble organic polymer, for example polyvinylpyrrolidone, polyacrylic acid, polyvinylbutyral, polysaccharides, gelatin or polyvinyl alcohol. The matting layer can be produced by generally known processes, for example by spraying-on a corresponding aqueous solution or dispersion and then drying the layer. The weight of the matting layer is generally from 0.1 to 0.5 g/m$^2$ of the recording material. During development (also known as "delamination" in the case of driographic printing plates) with water, the matting layer is removed completely.

The imagewise exposure of the recording material is generally carried out by contact imaging (in which the film mask is placed directly on the recording material in a vacuum contact copying frame, and the air in between is then sucked out) using the light sources usually used for this purpose, such as mercury high-pressure vapor lamps or carbon arc lamps. The exposed recording material is subsequently developed in a conventional and known apparatus for driographic printing plates using water or an aqueous solution. The development process is advantageously supported by brushing or in another mechanical manner. The silicone layer in the non-image areas is not removed in the process. Any spacer layer which may be present on the silicone layer is removed at the same time. It is even possible to omit pre-swelling of the exposed recording material. The constituents of the silicone layer which are detached during development can be separated off by filtration. The problem of disposal of spent developer solutions containing chemicals therefore does not arise.

The printing plates for driographic offset printing produced from the positive-working recording material according to the invention have high resolution and at the same time allow long print runs.

The examples below serve to illustrate the invention. In these examples, "pbw" stands for "parts by weight". Percentages are percent by weight, unless otherwise stated.

EXAMPLES 1 to 7:

An electrolytically roughened and anodically oxidized aluminum plate with a thickness of 0.3 mm and an oxide weight of 3.6 g/m$^2$ (±0.3 g/m$^2$) was hydrophilized using a 0.1% strength aqueous polyvinylphosphonic acid solution. This support material was spin-coated with a solution of 2.65 pbw of a diazonium salt polycondensation product prepared from 1 mol of 3-methoxydiphenlamine-4-diazonium sulfate and 1 mol of 4,4-bismethoxymethylidiphenyl ether, isolated as mesitylenesulfonate, 0.08 pbw of 85% strength phosphoric acid, 0.40 pbw of glycerol, 0.84 pbw of one of the binders listed in the following table (in the case of the dissolved binders, pbw relates to the solids content; in this case, the solvent is taken into account and reduced correspondingly), 2.40 pbw of a 1% strength silicone oil solution in diethylene glycol monomethyl ether (=methyldiglycol), 36.48 pbw of ethanol (if binders which are already dissolved in alcohols were used, this proportion was reduced correspondingly), 41.78 pbw of diethylene glycol monomethyl ether, and 15.36 pbw of butan-2-one (=methyl ethyl ketone).

The coating was then dried for 2 minutes at 120° C. in a fan-assisted oven. The thickness of the radiation-sensitive layers produced in this way is likewise shown in Table 1.

TABLE 1

| Example | Binder type | Layer thickness [g/m$^2$] |
|---|---|---|
| 1 | Methyl vinyl ether-maleic anhydride copolymer (alternating structure; $M_w$ = 216,000; 10% strength solution in ethanol) | 1.03 |
| 2 | Poly(methyl vinyl ether), K value = 50 | 0.85 |
| 3 | Poly(ethyl vinyl ether), K value = 12 | 0.75 |
| 4 | Monoethyl ester of a methyl vinyl ether-maleic acid copolymer ($M_w$ = 100,000 to 150,000; | 0.89 |

TABLE 1-continued

| Example | Binder type | Layer thickness [g/m²] |
|---|---|---|
| | 50% strength solution in ethanol) | |
| 5 | Monoisopropyl ester of a methyl vinyl ether-maleic acid copolymer ($M_w$ = 110,000 to 140,000; 50% strength solution in isopropanol) | 0.88 |
| 6 | Monobutyl ester of a methyl vinyl ether-maleic acid copolymer ($M_w$ = 90,000 to 150,000; 50% strength solution in ethanol) | 0.90 |
| 7 | Methyl vinyl ether-maleic acid copolymer ($M_w$ = 1,980,000) | 1.32 |

The radiation-sensitive layer was then coated with a mixture of 8.42 pbw of a hydroxyl-terminated polydimethylsiloxane having a viscosity of about 5000 mP s, 0.58 pbw of ethyltriacetoxysilane, 0.09 pbw of a 1% strength solution of dibutyltin acetate in an isoparaffinic hydrocarbon mixture having a boiling range of from 117 to 134° C., 27.30 pbw of butan-2-one, and 63.61 pbw of the isoparaffinic hydrocarbon mixture having a boiling range of from 117 to 134° C.

The layer produced in this way was dried at 120° C. for 2 minutes. The thickness layer was then 2.1 g/m².

The recording material produced in this way was subsequently exposed imagewise for 38 seconds under a positive mask with a 5 kW metal halide lamp at a distance of 110 cm. It was then developed in a customary unit for the development of driographic printing plates (the layer was developed therein with mechanical support). In the pre-swelling stage of this unit, normal water at about room temperature was used. The silicone rubber layer had then been removed in the areas not affected by the radiation, but the radiation-sensitive layer essentially remained on the support. The resultant printing plate had high resolution and high stability during printing, thus also enabling long print runs.

EXAMPLE 8

Comparative Example

A radiation-sensitive recording material with a silicone layer was produced as described in Examples 1 to 7. However, the radiation-sensitive layer was this time produced using a mixture of 2.67 pbw of a diazonium polycondensation product prepared from 1 mol of 3-methoxydiphenylamine-4-diazonium sulfate and 1 mol of 4,4-bismethoxymethoxydiphenyl ether, isolated as mesitylenesulfonate, 0.10 pbw of 85% strength phosphoric acid, 1.00 pbw of glycerol, 1.06 pbw of polyvinylbutyral (80 mol-% of vinylbutyral units, 18 mol-% of vinyl alcohol units and 2 mol-% of vinyl acetate units; $T_g$=72 to 78° C.), 0.15 pbw of Victoria Blue FBR (Basic Blue 55), 3.00 pbw of a 1% strength solution of a silicone oil (7Edaplan LA 411) in diethylene glycol monomethyl ether, 36.10 pbw of ethanol, 40.73 pbw of ethylene glycol monomethyl ether, and 15.20 pbw of butan-2-one.

After drying, the radiation-sensitive layer produced therefrom had a thickness of 1.1 g/m².

The recording material was exposed imagewise and developed as in the examples according to the invention. However, the silicone layer could not be removed in the unexposed areas of the recording material, so a usable printing plate could not be obtained.

EXAMPLE 9

Comparative Example

Example 8 was repeated with the single difference that the polyvinylbutyral was replaced by the same amount of a product of the reaction of polyvinylbutyral and maleic anhydride (as described in German Published Application DE-A 34 04 366, incorporated herein by reference) and the thickness of the radiation-sensitive layer was 1.0 g/m². The same result as in example 8 was achieved.

Although the present invention has been described in detail through preferred embodiments, the invention is not limited thereto, and various modifications and alterations within the spirit and scope of the invention are possible by those skilled in the art. The German priority application Serial No. DE 19852256.4 filed Nov. 11, 1998 is incorporated by reference herein in its entirety.

We claim:

1. A recording material comprising:

a support;

a radiation-sensitive layer and a silicone layer;

wherein the radiation-sensitive layer contains:

a radiation-sensitive component comprising a diazonium salt polycondensation product; and a binder comprising at least one of a homopolymer of ($C_1$–$C_{12}$) alkyl vinyl ether units and a copolymer which comprises at least 5 mol percent of such units, and is at least substantially free of aliphatic hydroxyl groups.

2. A recording material as claimed in claim 1, wherein the proportion of the radiation-sensitive component is from 20 to 80% by weight, based on the total weight of the nonvolatile constituents of the radiation-sensitive layer.

3. A recording material as claimed in claim 2, wherein the proportion of the radiation-sensitive component is from 30 to 70% by weight, based on the total weight of the nonvolatile constituents of the radiation-sensitive layer.

4. A recording material as claimed in claim 3, wherein the proportion of the radiation-sensitive component is from 40 to 65% by weight, based on the total weight of the nonvolatile constituents of the radiation-sensitive layer.

5. A recording material as claimed in claim 1, wherein the binder comprises a homopolymer of methyl vinyl ether units or a copolymer containing methyl vinyl ether units.

6. A recording material as claimed in claim 1, wherein the copolymer further comprises units of maleic anhydride or monoalkyl maleates.

7. A recording material as claimed in claim 6, wherein the units of monoalkyl maleates comprise units of mono ($C_1$–$C_6$) alkyl maleates.

8. A recording material as claimed in claim 7, wherein the units of mono ($C_1$–$C_6$) alkyl maleates comprise units of monoethyl, monoisopropyl or monobutyl maleate.

9. A recording material as claimed in claim 1, wherein the homopolymer or copolymer used as a binder in the radiation-sensitive layer has a molecular weight, $M_W$, in the range from 40,000 to 2,000,000.

10. A recording material as claimed in claim 9, wherein the homopolymer or copolymer used as a binder in the radiation-sensitive layer has a molecular weight, $M_w$, in the range from 50,000 to 1,000,000.

11. A recording material as claimed in claim 10, wherein the homopolymer or copolymer used as a binder in the radiation-sensitive layer has a molecular weight, $M_w$, in the range from 80,000 to 500,000.

12. A recording material as claimed in claim 1, wherein the proportion of the binder is from 5 to 40% by weight, based on the total weight of the non-volatile constituents of the radiation-sensitive layer.

13. A recording material as claimed in claim 1, wherein the diazonium salt polycondensation product is obtained by condensation of a polycyclic aromatic diazonium compound with an active carbonyl compound.

14. A recording material as claimed in claim 13, wherein the polycyclic aromatic diazonium compound comprises a substituted or unsubstituted diphenylamine-4-diazonium salt and the active carbonyl compound comprises methoxymethyldiphenyl ether or formaldehyde.

15. A recording material as claimed in claim 1, wherein the radiation-sensitive layer additionally contains dyes or plasticizers.

16. A recording material as claimed in claim 15, wherein the radiation-sensitive layer contains glycerol.

17. A recording material as claimed in claim 1, wherein the weight of the radiation-sensitive layer is from about 0.5 to 3.0 $g/m^2$.

18. A recording material as claimed in claim 17, wherein the weight of the radiation-sensitive layer is from 0.8 to 1.5 $g/m^2$.

19. A recording material as claimed in claim 1, wherein the silicone layer includes a condensation silicone rubber.

20. A recording material as claimed claim 1, wherein the weight of the silicone layer is from 1.0 to 5.0 $g/m^2$.

21. A recording material as claimed claim 20, wherein the weight of the silicone layer is from 1.2 to 3.5 $g/m^2$.

22. A recording material as claimed claim 21, wherein the weight of the silicone layer is from 1.5 to 3.0 $g/m^2$.

23. A recording material as claimed in claim 1, wherein a discontinuous matting layer is present on the silicone layer.

24. A recording material as claimed in claim 23, wherein the matting layer comprises a water-soluble organic polymer.

25. A recording material as claimed in claim 24, wherein the water-soluble organic polymer comprises polyvinylpyrrolidone, polyacrylic acid, polyvinylbutyral, polysaccharides, gelatin or polyvinyl alcohol.

26. A recording material as claimed in claim 1, wherein the support comprises an electrochemically roughened aluminum or an aluminum alloy.

27. A recording material as claimed in claim 1, wherein the radiation-sensitive layer is applied directly to the support.

28. A recording material as claimed in claim 1, wherein said copolymer is free of aliphatic hydroxyl groups.

29. A process for producing a printing plate for driographic offset printing, wherein the recording material as claimed in claim 1 is exposed imagewise and subsequently developed using water or an aqueous solution.

* * * * *